United States Patent
Hagiwara et al.

(12) 
(10) Patent No.: US 6,194,126 B1
(45) Date of Patent: Feb. 27, 2001

(54) PATTERN-FORMING PROCESS USING PHOTOSENSITIVE RESIN COMPOSITION

(75) Inventors: Hideo Hagiwara; Makoto Kaji; Masataka Nunomura, all of Hitachi (JP)

(73) Assignee: Hitachi Chemical Co., Ltd., Tokyo (JP)

(*) Notice: Subject to any disclaimer, the term of this patent is extended or adjusted under 35 U.S.C. 154(b) by 0 days.

(21) Appl. No.: 09/136,610

(22) Filed: Aug. 20, 1998

Related U.S. Application Data

(62) Division of application No. 08/664,515, filed on Jun. 17, 1996, now Pat. No. 5,856,059, which is a continuation of application No. 08/299,628, filed on Sep. 2, 1994, now abandoned.

(30) Foreign Application Priority Data

Sep. 3, 1993 (JP) .................................... 5-219720
Jan. 14, 1994 (JP) ......................................... 6-2282

(51) Int. Cl.$^7$ .............. G03F 7/30; G03F 7/012; G03F 7/031; G03F 7/037
(52) U.S. Cl. .............. 430/311; 430/196; 430/197; 430/281.1; 430/283.1; 430/325; 430/330; 430/905
(58) Field of Search .................. 430/325, 326, 430/330, 311, 196, 197, 905, 281.1, 283.1

(56) References Cited

U.S. PATENT DOCUMENTS

| | | | |
|---|---|---|---|
| 4,243,743 | 1/1981 | Hiramoto et al. | 430/281.1 |
| 4,451,551 | 5/1984 | Kataoka et al. | 430/197 |
| 4,565,767 | 1/1986 | Kataoka et al. | 430/196 |
| 4,587,197 | 5/1986 | Kojima et al. | 430/196 |
| 4,608,333 | 8/1986 | Ohbayashi et al. | 430/906 |
| 4,783,391 | 11/1988 | Ohbayashi et al. | 430/196 |
| 5,238,784 | 8/1993 | Tokoh et al. | 430/196 |
| 5,399,460 | * 3/1995 | Aldrich et al. | 430/287.1 |

FOREIGN PATENT DOCUMENTS

| | | |
|---|---|---|
| 418870A2 | 3/1991 | (EP) . |
| 580108 | 1/1994 | (EP) . |
| 624826A1 | 11/1994 | (EP) . |
| 718696A2 | 6/1996 | (EP) . |
| 3-36861 | 6/1991 | (JP) . |

OTHER PUBLICATIONS

The Society of Polymer Science, Japan, Polymer Preprints, Japan vol.41 No. 1 (1992).
The Society of Polymer Science, Japan, Polymer Preprints, Japan vol. 42, No. 7 (1993).
The Society of Polymer Science, Japan, Polymer Preprints, Japan. vol. 42, No. 2 (1993).

* cited by examiner

*Primary Examiner*—John S. Chu
(74) *Attorney, Agent, or Firm*—Antonelli, Terry, Stout & Kraus, LLP.

(57) ABSTRACT

There are disclosed a photosensitive resin composition which comprises
(A) a polyamic acid having recurring units represented by the formula (I):

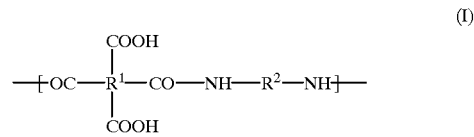

(I)

wherein $R^1$ represents

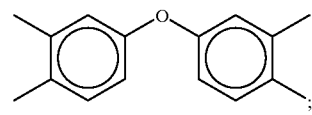

and $R^2$
represents a divalent organic group, and
(B) an acryl compound having an amino group,
and also a photosensitive resin composition for an i-line stepper which further comprises a photoinitiator in addition to the photosensitive resin composition.

20 Claims, No Drawings

PATTERN-FORMING PROCESS USING PHOTOSENSITIVE RESIN COMPOSITION

This application is a Divisional application of application Ser. No. 08/664,515, filed Jun. 17, 1996, now U.S. Pat. No. 5,856,059 which is a Continuation application of application Ser. No. 08/299,628, filed Sep. 2, 1994 now abandoned.

BACKGROUND OF THE INVENTION

This invention relates to a photosensitive resin composition and a photosensitive resin composition for an i-line stepper which contains a photoinitiator.

In the semiconductor industries, inorganic materials have conventionally been used for interlaminar insulation. Recently, organic materials having an excellent heat-resistance such as a polyimide resin have been put to use as materials for interlaminar insulation because of properties thereof.

A process for forming a pattern in a semiconductor integrated circuit or forming a pattern of a circuit on a print substrate comprises complex and various steps such as film formation of a resist material on a substrate surface; exposure of required portion to light; removal of unnecessary portion by etching or the like; and washing of the substrate surface. Therefore, development of heat-resistant photosensitive materials have been desired, which enables the required portion of the resist material to be remained as such and used as insulating materials even after the pattern is formed by exposure to light and development.

As such a material, heat-resistant photosensitive materials comprising, for example, a photosensitive polyimide or a cyclized polybutadiene as a base polymer have been proposed. The photosensitive polyimide has particularly attracted attentions since it has an excellent heat-resistance and impurities contained therein can easily be removed.

As such a photosensitive polyimide, for example, one which comprises a polyimide precursor and a bichromate has been proposed for the first time in Japanese Patent Publication No. 17374/1974. This photosensitive polyimide has an advantage that it has a photosensitivity suitable for practical uses and also has a high film-forming ability. However, it also has a disadvantage that it has a low preservability and a low stability and that a chromium ion remains in the polyimide, and therefore it has not been put to practical use.

As another example, a photosensitive polyimide precursor in which a photosensitive group is introduced into a polyamic acid (polyimide precursor) by an ester bond has been proposed in Japanese Patent Publication No. 30207/1980. This material has a disadvantage that a finally obtained product contains a chloride since a step for introducing the photosensitive group comprises a dehydrochlorination reaction.

In order to avoid these problems, for example, a process for mixing a compound which contains a photosensitive group with a polyimide precursor is disclosed in Japanese Provisional Patent Publication No. 109828/1979; and a process for affording photosensitivity to a polyimide precursor by reacting a functional group in the polyimide precursor with a functional group of a photosensitive group-containing compound is disclosed in Japanese Provisional Patent Publications No. 24343/1981 and No. 100143/1985.

However, the photosensitive polyimide precursor employs an aromatic monomer having an excellent heat-resistance and mechanical property as a fundamental structure and has a low light-transmittance in the ultraviolet region because the polyimide precursor itself absorbs the ultraviolet light. Therefore, photochemical reactions at the exposed portion are not sufficiently caused which results in the low sensitivity or unclear patterns.

Recently, the higher and higher reduction has increasingly been required for a rule for producing a semiconductor, accompanied by the higher integration of semiconductors. Therefore, in addition to a conventional contact/proximity exposing machine using parallel rays, a 1:1 projection exposing machine called as a mirror projection and a reduced projection exposing machine called as a stepper have increasingly been used. The stepper utilizes monochromatic light such as a high power oscillation line of ultra-high pressure mercury lamp, an excimer laser. As the stepper, a g-line stepper which employs a visible light (wavelength of 435 nm) called as a g-line of ultra-high pressure mercury lamp has conventionally been used in many cases. However, further reduction of processing rule has been required. The process has already been carried out around the lower limit of diffraction of light and therefore it is required to shorten the wavelength of the stepper used for carrying out finer processing. Thus an i-line stepper having a wavelength of 365 nm has increasingly been used instead of the g-line stepper having a wavelength of 435 nm. However, a base polymer of a conventional photosensitive polyimide designed for the contact/proximity exposing machine, the mirror projection exposing machine or the g-line stepper, having a low transparency for the above-described reason, has substantially no transmittance particularly for the i-line having a wavelength of 365 nm. Therefore, the i-line stepper does not provide any useful pattern. On the other hand, as a polyimide film for surface protection, a further thicker film has been required in response to a LOC (lead on chip) which is a high density assembly method of a semiconductor element. When such a thicker film is used, the low light-transmittance causes more serious problem. For the above reasons, a photosensitive polyimide which is designed for the i-line stepper and has a high transmittance for the i-line has been highly required.

SUMMARY OF THE INVENTION

The present invention is to overcome the above described problems and it is an object of the present invention to provide a photosensitive resin composition and a photosensitive resin composition for an i-line stepper which contains a photoinitiator and which transmits light to be used for exposure sufficiently and also has an excellent image-forming ability with an i-line stepper, film property, heat-resistance and adhesive property.

The present invention relates to a photosensitive resin composition which comprises (A) a polyamic acid having a recurring unit represented by the formula (I):

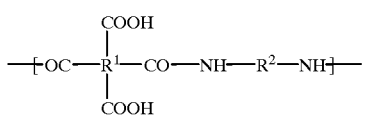

(I)

wherein R¹ represents

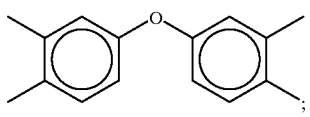

and R² represents a divalent organic group, and (B) an acryl compound having an amino group, and relates to a photosensitive resin composition for an i-line stepper which further comprises a photoinitiator in addition to the above photosensitive resin composition.

DESCRIPTION OF THE PREFERRED EMBODIMENT

In the following, the present invention is explained in detail.

In the formula (I), R¹ is as defined above, and as R², there may be mentioned a divalent aryl group such as

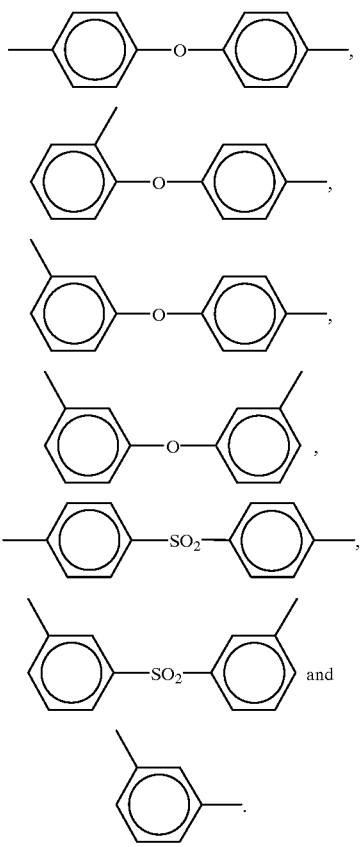

Of these, particularly preferred are

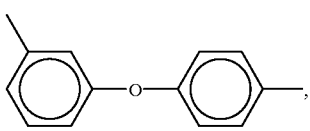

-continued

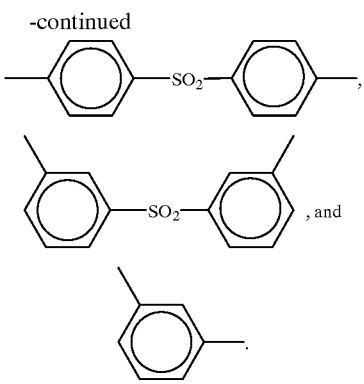

The polyamic acid (A) may contain at least one other recurring unit than the recurring unit represented by the formula (I). The recurring unit represented by the formula (I) is contained 20 to 100 mole % based on the total amount of the recurring unit in the polyamic acid (A).

The polyamic acid (A) of the present invention can be obtained, for example, by carrying out a ring-opening polyaddition reaction of an acid component comprising oxydiphthalic acid or oxydiphthalic anhydride (trade name, 3,3',4, 4'-biphenyl ether tetracarboxylic dianhydride, hereinafter the same) and, if necessary, at least one other tetracarboxylic dianhydride, with a diamine in an organic solvent.

The oxydiphthalic acid and/or oxydiphthalic anhydride is/are used in total in an amount of 20 to 100 mole % based on the total amount of the acid component.

As the other tetracarboxylic dianhydride which may be used if necessary, there may be mentioned, for example, an aromatic tetracarboxylic dianhydride such as pyromellitic dianhydride, 3,3',4,4'-benzophenonetetracarboxylic dianhydride, 3,3',4,4'-biphenyltetracarboxylic dianhydride, 1,2,5,6-naphthalenetetracarboxylic dianhydride, 2,3,6,7-naphthalenetetracarboxylic dianhydride, 2,3,5,6-pyridinetetracarboxylic dianhydride, 1,4,5,8-naphthalenetetracarboxylic dianhydride, 3,4,9,10-perylenetetracarboxylic dianhydride, sulfonyldiphthalic anhydride, m-terphenyl-3,3',4,4'-tetracarboxylic dianhydride, p-terphenyl-3,3',4,4'-tetracarboxylic dianhydride, 1,1,1,3,3,3-hexafluoro-2,2-bis(2,3- or 3,4-dicarboxyphenyl)propane dianhydride, 2,2-bis(2,3- or 3,4-dicarboxyphenyl)propane dianhydride, 2,2-bis{4-(2,3- or 3,4-dicarboxyphenoxy)phenyl}propane dianhydride, 1,1,1,3,3,3-hexafluoro-2,2-bis{4-(2,3- or 3,4-dicarboxyphenoxy)phenyl}propane dianhydride and a tetracarboxylic anhydride represented by the formula (II):

(II)

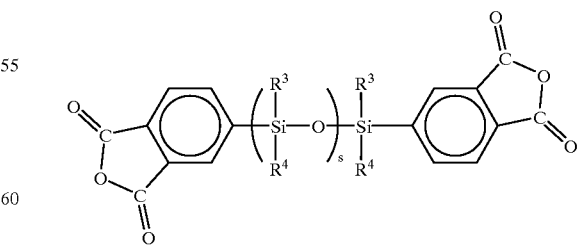

wherein R³ and R⁴ may be the same or different from each other and each represent a monovalent hydrocarbon group; s is an integer of 1 to 5; and when s is 2 or more, respective R³s or R⁴s may be the same or different from each other, and the above tetracarboxylic dianhydrides may be used singly or in combination of two or more.

In the formula (II), the monovalent hydrocarbon group of $R^3$ and $R^4$ may include an alkyl group having 1 to 6 carbon atoms such as a methyl group, an ethyl group, a n-propyl group, an isopropyl group, a n-butyl group, an isobutyl group, a sec-butyl group, a tert-butyl group, a pentyl group and a hexyl group; and a phenyl group, said phenyl group may be substituted by an alkyl group having 1 to 6 carbon atoms.

The above tetracarboxylic dianhydrides may be used if necessary in addition to oxydiphthalic anhydride which is an essential component. It may be used in an amount of 80 mole % or less based on the total amount of the acid component so that the transmittance of the formed polyamic acid is not lowered.

As the above diamine, which are not particularly limited, there may preferably be used 4,4'-diaminodiphenyl ether, 2,4'-diaminodiphenyl ether, 3,4'-diaminodiphenyl ether, 3,3'-diaminodiphenyl ether, 4,4,'-diaminodiphenyl sulfone, 3,3,'-diaminodiphenyl sulfone and metaphenylenediamine. Among them, 3,4'-diaminodiphenyl ether, 3,3'-diaminodiphenyl sulfone, 4,4'-diaminodiphenyl sulfone and methaphenylenediamine are more preferred. These compounds may be used singly or in combination of two or more.

In addition to the above diamine, there may be used with an amount which does not lower the transmittance of the resulting polyimide precursor, for example, p-phenylenediamine, p-xylylenediamine, 1,5-diaminonaphthalene, 3,3'-dimethylbenzidine, 3,3,-dimethoxybenzidine, 4,4'- (or 3,4'-, 3,3'-, 2,4'-, 2,2'-)diaminodiphenylmethane, 2,2'-diaminodiphenyl ether, 3,4'- (or 2,4'-, 2,2'-)diaminodiphenyl sulfone, 4,4'- (or 3,4'-, 3,3'-, 2,4'-, 2,2'-)diaminodiphenylsulfide, 4,4'-benzophenonediamine, bis{4-(4'-aminophenoxy)phenyl}sulfone, 1,1,1,3,3,3-hexafluoro-2,2-bis(4-aminophenyl)propane, 2,2-bis{4-(4'-aminophenoxy)phenyl}propane, 3,3,'-dimethyl-4,4,'-diaminodiphenylmethane, 3,3',5,5'-tetramethyl-4,4'-diaminodiphenylmethane, bis{4-(3'-aminophenoxy)phenyl}sulfone, 2,2-bis(4-aminophenyl)propane, and an aliphatic diamine such as a diaminopolysiloxane represented by the formula (III):

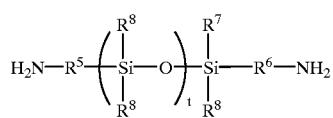

(III)

wherein $R^5$ and $R^6$ each represent a divalent hydrocarbon group, preferably a divalent hydrocarbon group having 1 to 3 carbon atoms; $R^7$ and $R^8$ each represent a monovalent hydrocarbon group, preferably a monovalent hydrocarbon group having 1 to 3 carbon atoms; each of $R^5$, $R^6$, $R^7$ and $R^8$'s may be the same or different; and t represents an integer of 1 to 5.

As the above diaminopolysiloxane, there may be used, for example, 1,3-bis(3-aminopropyl)-,1,1,3,3-tetramethyldisiloxane.

An amount of the compound of the formula (III) may be 1 to 10 mole % based on the total amount of the diamine component.

There may be also used a hydroxyl group-containing diamine such as 3,3'-hydroxybenzidine, 3,4'-diamino-3',4-dihydroxybiphenyl, 3,3,'-dihydroxy-4,4'-diaminodiphenyloxide, 3,3,'-dihydroxy-4,4'-diaminodiphenylsulfone, 2,2-bis(3-amino-4-hydroxyphenyl)propane, 1,1,1,3,3,3-hexafluoro-2,2-bis-(3-amino-4-hydroxyphenyl) propane, bis-(3-hydroxy-4-aminophenyl)methane, 3,3'-dihydroxy-4,4'-diaminobenzophenone, 1,1-bis(3-hydroxy-4-aminophenyl)ethane, 2,2-bis-(3-hydroxy-4-aminophenyl)propane, 1,1,1,3,3,3-hexafluoro-2,2-bis-(3-hydroxy-4-aminophenyl) propane, 1,3-diamino-4-hydroxybenzene, 1,3-diamino-5-hydroxybenzene, 1,3-diamino-4,6-dihydroxybenzene, 1,4-diamino-2-hydroxybenzene, and 1,4-diamino-2,5-dihydroxybenzene. These compounds may be used singly or in combination of two or more.

As the organic solvent to be used for the above reaction, a polar solvent which completely dissolves the formed polyimide precursor is generally preferred. There may be mentioned, for example, N-methyl-2-pyrrolidone, N,N-dimethylacetamide, N,N-dimethylformamide, dimethylsulfoxide, tetramethylurea, hexamethylphosphoric triamide and γ-butyrolactone.

In addition to these polar solvents, ketones, esters, lactones, ethers, halogenated hydrocarbons, hydrocarbons, for example, acetone, methyl ethyl ketone, methyl isobutyl ketone, cyclohexanone, methyl acetate, ethyl acetate, butyl acetate, diethyl oxalate, diethyl malonate, diethyl ether, ethylene glycol dimethyl ether, diethylene glycol dimethyl ether, tetrahydrofurane, dichloromethane, 1,2-dichloroethane, 1,4-dichlorobutane, trichloroethane, chlorobenzene, o-dichlorobenzene, hexane, heptane, octane, benzene, toluene, and xylene.

These organic solvents may be used singly or in combination of two or more.

The organic solvent is used in an amount of 50 to 95% by weight based on the total amount of the ring-opening polyaddition reaction solution, and the polar solvent is used in an amount of 40 to 100% by weight based on the total amount of the organic solvent. If necessary, water may be contained in the solvent used for the above reaction. When water is contained, the solvent including the organic solvent and water is used in amount of 50 to 95% by weight based on the total amount of the above solution, and the amount of water is 0.5 to 6% by weight based on the total weight of the solvent.

The polyamic acid can be prepared by reacting the above acid component and the diamine, for example, in an amount of preferably 0.8 to 1.2 in terms of the molar ratio of the acid/the diamine, more preferably about 1.0, at a temperature of 0 to 100° C. at around normal pressure for 30 minutes to 10 hours.

The resulting polyamic acid has a number average molecular weight (Mn) of 3,000 to 200,000, preferably 5,000 to 100,000, more preferably 7,000 to 50,000. Also, the resulting polyamic acid solution has a viscosity of 1 to 300 poise, preferably 30 to 200 poise, and a solid component of 5 to 50% by weight, preferably 10 to 30% by weight.

As the acryl compound having an amino group to be used as Component (B) in the present invention, there may be mentioned, for example, N,N-dimethylaminoethyl methacrylate, N,N-diethylaminoethyl methacrylate, N,N-dimethylaminopropyl methacrylate, N,N-diethylaminopropyl methacrylate, N,N-dimethylaminoethyl acrylate, N,N-diethylaminoethyl acrylate, N,N-dimethylaminopropyl acrylate, N,N-diethylaminopropyl acrylate, N,N-dimethylaminoethylacrylamide, and N,N-diethylaminoethylacrylamide. These acryl compounds may be used singly or in combination of two or more.

The acryl compound having an amino group (B) may be used in an amount of preferably 1 to 200% by weight, more preferably 5 to 50% by weight, based on the amount of the polyamic acid containing the recurring unit represented by the formula (I) in consideration of photosensitivity and strength of the heat-resistant film. When the acryl compound is used, affinity with the polyamic acid can be improved.

The photosensitive resin composition of the present invention may contain, if necessary, (C) a photoinitiator as shown below. Such a composition can be used as a photosensitive resin composition for an i-line stepper. As the photoinitiator (C), there may be mentioned, for example, Michler's ketone, benzoin methyl ether, benzoin ethyl ether, benzoin isopropyl ether, 2-t-butylanthraquinone, 2-ethylanthraquinone, 4,4,'-bis(diethylamino) benzophenone, acetophenone, benzophenone, thioxanthone, 2,2-dimethoxy-2-phenylacetophenone, 1-hydroxycyclohexyl phenyl ketone, 2-methyl-[4-(methylthio)phenyl]-2-morpholino-1-propanone, benzil, diphenyldisulfide, phenanthrenequinone, 2-isopropylthioxanthone, riboflavin tetrabutyrate, 2,6-bis(p-diethylaminobenzal)-4-methyl-4-azacyclohexanone, N-ethyl-N-(p-chlorophenyl)glycine, N-ethyl-N-(p-chlorophenyl)glycine, N-phenyl-diethanolamine, 2-(o-ethoxycarbonyl)oxyimino-1,3-diphenylpropanedione, 1-phenyl-2-(o-ethoxycarbonyl)oxyiminopropan-1-one, 3,3', 4,4'-tetra(t-butylperoxycarbonyl)benzophenone, 3,3'-carbonylbis(7-diethylaminocoumarin), bis(cyclopentadienyl)-bis[2,6-difluoro-3-(pyri-1-yl)phenyl] titanium. These compounds may be used singly or in combination of two or more.

The photoinitiator (C) may be used in an amount of preferably 0.01 to 30% by weight, more preferably 0.05 to 10% by weight based on the polyamic acid (A) having the recurring unit represented by the formula (I) in consideration of photosensitivity and strength of the film.

The photosensitive resin composition may contain, if necessary, an addition-polymerizable compound (D) as shown below. As the addition-polymerizable compound (D), there may be mentioned, for example, diethylene glycol diacrylate, triethylene glycol diacrylate, tetraethylene glycol diacrylate, diethylene glycol dimethacrylate, triethylene glycol dimethacrylate, tetraethylene glycol dimethacrylate, trimethylolpropane diacrylate, trimethylolpropane triacrylate, trimethylolpropane dimethacrylate, trimethylolpropane trimethacrylate, 1,4-butanediol diacrylate, 1,6-hexanediol diacrylate, 1,4-butanediol dimethacrylate, 1,6-hexanediol methacrylate, pentaerythritol triacrylate, pentaerythritol tetraacrylate, pentaerythritol trimethacrylate, pentaerythritol tetramethacrylate, styrene, divinylbenzene, 4-vinyltoluene, 4-vinylpyridine, N-vinylpyrrolidone, 2-hydroxyethyl acrylate, 2-hydroxyethyl methacrylate, 1,3-acryloyloxy-2-hydroxypropane, 1,3-methacryloyloxy-2-hydroxypropane, methylenebis(acrylamide), N,N-dimethylacrylamide, and N-methylolacrylamide. These compounds may be used singly or in combination of two or more.

The addition-polymerizable compound (D) may preferably be used in an amount of 1 to 200% by weight based on the polyamic acid having the recurring unit represented by the formula (I) in consideration of solubility in a developer, photosensitivity or strength of the film.

The photosensitive resin composition of the present invention may contain, if necessary, an azido compound (E) as shown below. As the azido compound (E), there may be to mentioned, for example, the following compounds:

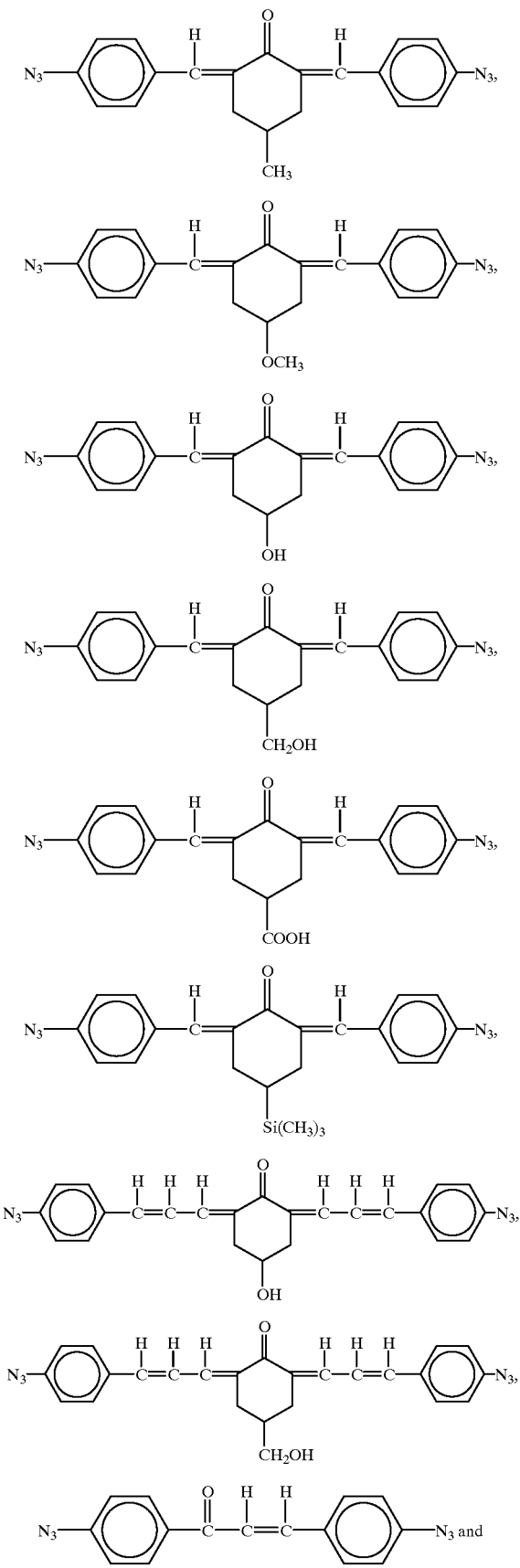

-continued

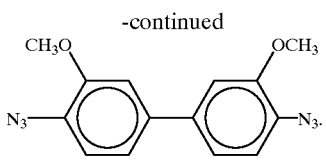

The azido compound may be used singly or in combination of two or more.

These compounds (E) may be used in an amount of preferably 0.01 to 30% by weight, more preferably 0.05 to 10% by weight based on the polyamic acid having the recurring unit represented by the formula (I) in consideration of photosensitivity and strength of the film.

The photosensitive resin composition of the present invention may contain a radical polymerization-inhibiting agent or a radical polymerization-suppressing agent such as p-methoxyphenol, hydroquinone, pyrogallol, phenothiazine, and a nitrosoamine.

The photosensitive resin composition of the present invention may be applied to a substrate such as a silicon wafer, a metal substrate, a glass substrate and a ceramic substrate by a dipping method, a spraying method, a screen printing method or a spinner coating method, then heat-dried to evaporate most of the solvent so that a film having no tackiness can be obtained.

The film is irradiated with active rays or chemical rays through a mask having required patterns. The material of the present invention is suitable for an i-line stepper, but a contact/proximity exposing machine employing an ultrahigh-pressure mercury lamp, a mirror projection exposing machine (aligner), a g-line stepper or the other sources of ultraviolet rays, far-ultraviolet rays, visible light, X rays or electron rays may be used as the source of active rays or chemical rays for irradiation. Among them, ultraviolet ray source may preferably be used as well as the i-line stepper. The required relief pattern can be obtained by dissolving and removing the non-irradiated portion with an appropriate developer after the irradiation.

As the developer, there may be used a good solvent having a high dissolving power such as N,N-dimethylformamide, N,N-dimethylacetamide and N-methyl-2-pyrrolidone, a mixed solvent of the above and a poor solvent having a low dissolving power such as a lower alcohol, water and an aromatic hydrocarbon, or a basic solution such as tetramethylammonium hydroxide aqueous solution and triethanolamine aqueous solution. After the development, the film was rinsed with water or a poor solvent and dried at around 100° C. so that the pattern is stabilized. The relief pattern is heated at 200 to 500° C., preferably 300 to 400° C. for several tens of minutes to several hours to form a highly heat-resistant polyimide having patterns.

The photosensitive resin composition of the present invention can be thus converted to a buffer coating film of a semiconductor or an interlaminar insulating film of a multi-layer wiring board.

EXAMPLES

The present invention is described in detail by referring to Examples and Comparative examples, but the scope of the invention is not limited by these Examples.

Synthetic Example 1

To a 100 ml-flask equipped with a stirrer, a thermometer and an inlet for introducing nitrogen gas were added 9.8917 g of 3,4'-diaminodiphenyl ether, 0.6462 g of 1,3-bis(3-aminopropyl)-1,1,3,3-tetramethyldisiloxane, 2.2484 g of water, 14.60 g of xylene and 58.38 g of N-methyl-2-pyrrolidone, and the mixture was dissolved by stirring under nitrogen flow at room temperature. Then, 16.4534 g of oxydiphthalic anhydride was added to the solution and the mixture was stirred for 5 hours to have a tacky polyamic acid (polyimide precursor) solution. The solution was heated at 70° C. for adjusting the viscosity at 80 poise to have a polymer solution called as P-1.

Synthetic Example 2

To a 500 ml flask equipped with a stirrer, a thermometer and an inlet for introducing nitrogen gas were added 49.4583 g of 2,4'-diaminodiphenyl ether, 3.2308 g of 1,3-bis(3-aminopropyl)-1,1,3,3-tetramethyldisiloxane, 72.10 g of xylene and 288.42 g of N-methyl-2-pyrrolidone and the mixture was dissolved by stirring at room temperature under nitrogen flow. Then, 80.6541 g of oxydiphthalic anhydride was added and the mixture was stirred for 5 hours to have a tacky polyamic acid (polyimide precursor) solution. The solution was then heated at 70° C. for adjusting the viscosity at 80 poise to have a polymer solution called as P-2.

Synthetic Example 3

To a 500 ml flask equipped with a stirrer, a thermometer and an inlet for introducing nitrogen gas were added 57.0855 g of 3,3'-diaminodiphenylsulfone, 3.0071 g of 1,3-bis(3-aminopropyl)-1,1,3,3-tetramethyldisiloxane, 73.09 g of xylene and 292.35 g of N-methyl-2-pyrrolidone and the mixture was dissolved by stirring at room temperature under nitrogen flow. Then, 75.0703 g of oxydiphthalic anhydride was added to the solution and the mixture was stirred for 5 hours to have a tacky polyamic acid (polyimide precursor) solution. The solution was then heated at 70° C. for adjusting the viscosity at 80 poise to have a polymer solution called as P-3.

Synthetic Example 4

To a 500 ml flask equipped with a stirrer, a thermometer and an inlet for introducing nitrogen gas were added 57.0855 g of 4,4'-diaminodiphenylsulfone, 3.0071 g of 1,3-bis(3-aminopropyl)-1,1,3,3-tetramethyldisiloxane, 73.09 g of xylene and 292.35 g of N-methyl-2-pyrrolidone and the mixture was dissolved by stirring at room temperature under nitrogen flow. Then, 75.0703 g of oxydiphthalic anhydride was added to the solution and the mixture was stirred for 5 hours to have a tacky polyamic acid (polyimide precursor) solution. The solution was heated at 70° C. for adjusting the viscosity at 80 poise to have a polymer solution called as P-4.

Synthetic Example 5

To a 100 ml-flask equipped with a stirrer, a thermometer and an inlet for introducing nitrogen gas were added 6.3697 g of methaphenylenediamine, 0.7704 g of 1,3-bis(3-aminopropyl)-1,1,3,3-tetramethyldisiloxane, 2.6808 g of water, 14.47 g of xylene and 57.88 g of N-methyl-2-pyrrolidone and the mixture was dissolved by at room temperature under nitrogen flow. Then, 19.6176 g of oxydiphthalic anhydride was added to the solution and the mixture was stirred for 5 hours to have a tacky polyamic acid (polyimide precursor) solution. The solution was then heated at 70° C. for adjusting the viscosity at 80 poise to have a polymer solution called as P-5.

Synthetic Example 6

To a 200 ml-flask equipped with a stirrer, a thermometer and an inlet for introducing nitrogen gas were added 19.5931 g of 4,4'-diaminodiphenyl ether, 1.2799 g of 1,3-bis(3-aminopropyl)-1,1,3,3-tetramethyldisiloxane, 4.4536 g of water, 29.26 g of γ-butyrolactone and 117.02 g of N-methyl-2-pyrrolidone and the mixture was dissolved by stirring at room temperature under nitrogen flow. Then, 33.2295 g of oxydiphthalic anhydride was added to the solution and the mixture was stirred for 5 hours to have a polyamic acid (polyimide precursor) solution. The solution was then heated at 70° C. for adjusting the viscosity at 80 poise to have a polymer solution called as P-6.

Synthetic Example 7

To a 100 ml-flask equipped with a stirrer, a thermometer and an inlet for introducing nitrogen gas were added 11.9841 g of 4,4'-diaminodiphenyl ether, 0.7829 g of 1,3-bis(3-aminopropyl)-1,1,3,3-tetramethyldisiloxane, 2.7240 g of water, 14.48 g of xylene and 57.93 g of N-methyl-2-pyrrolidone and the mixture was dissolved by stirring at room temperature under nitrogen flow. Then, 14.0161 g of pyromellitic dianhydride was added to the solution and the mixture was stirred for 5 hours to have a tacky polyamic acid (polyimide precursor) solution. The solution was then heated at 70° C. for adjusting the viscosity at 80 poise to have a polymer solution called as P-7.

Synthetic Example 8

To a 100 ml-flask equipped with a stirrer, a thermometer and an inlet for introducing nitrogen gas were added 10.0819 g of 4,4'-diaminodiphenyl ether, 0.6586 g of 1,3-bis(3-aminopropyl)-1,1,3,3-tetramethyldisiloxane, 2.2916 g of water, 14.41 g of xylene and 90.05 g of N-methyl-2-pyrrolidone and the mixture was dissolved by stirring at room temperature under nitrogen flow. Then, 15.9049 g of biphenyltetracarboxylic dianhydride was added to the solution and the mixture was stirred for 5 hours to have a polyamic acid (polyimide precursor) solution. The solution was then heated at 70° C. for adjusting the viscosity at 80 poise to have a polymer solution called as P-8.

The transmittance at 365 nm of films of the polyamic acid (polyimide precursor) solutions P-1 to P-8 prepared in Synthetic examples 1 to 8 are shown in Table 1. The transmittance of the polyamic acid solution was determined by measuring the transmittance of a film obtained by spin-coating a glass substrate with the resin solution of the polyamic acid (polyimide precursor) and drying it at 85° C. for 3 minutes and then at 105° C. for 3 minutes.

TABLE 1

| | Polyamic acid solution | Transmittance (%) (thickness: 20 μm, at 365 nm) |
|---|---|---|
| Synthetic example 1 | P-1 | 43 |
| Synthetic example 2 | P-2 | 48 |
| Synthetic example 3 | P-3 | 68 |
| Synthetic example 4 | P-4 | 60 |
| Synthetic example 5 | P-5 | 62 |
| Synthetic example 6 | P-6 | 40 |
| Synthetic example 7 | P-7 | less than 1 |
| Synthetic example 8 | P-8 | less than 1 |

As can be seen from the above Table 1, the films obtained from the polyamic acid solutions of the present invention (Synthetic examples 1 to 6) had good transmittances to the light having a wavelength of 365 nm (i.e., i-line). To the contrary, in the films of comparative purpose (Synthetic examples 7 and 8), i-line light was substantially absorbed by the films.

Examples 1 to 6

To each 10 g of the polyamic acid (polyimide precursor) solutions P-1 to P-6 prepared in Synthetic examples 1 to 6 were added N,N-dimethylaminopropyl methacrylate (MDAP), 2,6-bis(4'-azidobenzal)-4-carboxycyclohexanone (CA), 4,4'-bis(diethylamino)benzophenone (EAB) and 1-phenyl-2-(O-ethoxycarbonyl)oxyiminopropan-1-one (PDO) in a prescribed amount as shown in Table 2 and were mixed while stirring to have uniform photosensitive resin composition solutions which were to be used in Examples 1 to 6, respectively.

Comparative Examples 1 and 2

To each 10 g of the polyamic acid (polyimide precursor) solutions P-7 and P-8 prepared in Synthetic examples 7 to 8 were added MDAP, CA, EAB and PDO in a prescribed amount as shown in Table 2 and were mixed while stirring to have uniform photosensitive resin composition solutions which were to be used in Comparative examples 1 to 2, respectively.

TABLE 2

| | Polyamic acid solution | Formulation (g) | | | |
|---|---|---|---|---|---|
| | | MDAP | CA | EAB | PDO |
| Example 1 | P-1 | 1.803 | 0.027 | 0.027 | 0.054 |
| Example 2 | P-2 | 1.803 | 0.027 | 0.027 | 0.054 |
| Example 3 | P-3 | 1.656 | 0.027 | 0.027 | 0.054 |
| Example 4 | P-4 | 1.656 | 0.027 | 0.027 | 0.054 |
| Example 5 | P-5 | 2.174 | 0.027 | 0.027 | 0.054 |
| Example 6 | P-6 | 1.803 | 0.027 | 0.027 | 0.054 |
| Comparative example 1 | P-7 | 2.198 | 0.027 | 0.027 | 0.054 |
| Comparative example 2 | P-8 | 1.861 | 0.027 | 0.027 | 0.054 |

MDAP, CA, EAB and PDO used in Examples 1 to 6 and Comparative examples 1 to 2 were represented by the formulae:

MDAP (N,N-dimethylaminopropyl methacrylate):

$CH_2{=}C(CH_3)CO_2(CH_2)_3N\,(CH_3)_2;$

CA (2,6-bis(4'-azidobenzal)-4-carboxycyclohexanone):

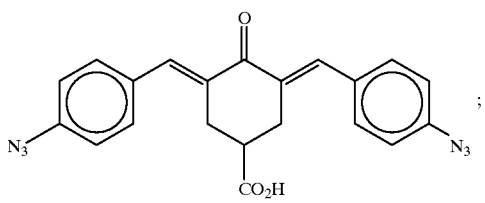

EAB (4,4'-bis(diethylamino)benzophenone):

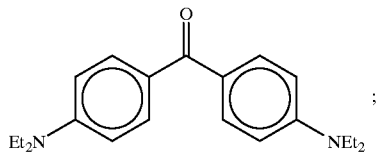

PDO (1-phenyl-2-(O-ethoxycarbonyl)oxyiminopropan-1-one):

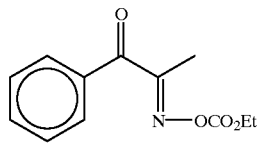

The each obtained solution was filtered and was drip spin-coated on a silicon wafer. Then, the wafer was heated at 100° C. for 150 seconds by using a hot plate to form a film having a thickness of 20 μm and the film was exposed by using an i-line stepper through a mask having patterns. The film was heated at 110° C. for 50 seconds and subjected to puddle development using a mixed solution comprising N-methyl-2-pyrrolidone and water with a weight ratio of 75:25. Then, the film was heated at 100° C. for 30 minutes, at 200° C. for 30 minutes and then at 350° C. for 60 minutes under nitrogen atmosphere to have the relief pattern of the polyimide.

Evaluation results thereof are shown in Table 3. The resolution, the post-developmental film-remaining ratio and the adhesive property were evaluated using methods as mentioned below, respectively.

The resolution was evaluated as the minimal size of developable through-hole by using a through-hole test pattern.

The post-developmental film remaining ratio was determined as (the thickness after development/the thickness before development) ×100 (%) by measuring the thicknesses of the film before and after the development. The film thickness was measured with a film thickness measurement apparatus, Dektak-3030 (trade name) manufactured by Sloan Co.

Adhesive property was measured as follows. A film (film thickness: 5 μm) obtained by coating a silicon wafer with the photosensitive resin composition and heating it at 100° C. for 30 minutes, at 200° C. for 30 minutes and then at 350° C. for 60 minutes was subjected to a Pressure Cooker test (conditions: at 121° C., 2 atmospheric pressure for loo hours) and then carried out a checkerboard test.

In the checkerboard test, the film was cut like a checkerboard by a knife so that 100 squares per 1 mm² are formed and peeled off by using a cellophane tape regulated by Japanese Industrial Standard (JIS K5400) to determine the ratio of the number of remaining squares to 100. The results are shown in Table 3.

TABLE 3

| | Resolution (μm) | Pattern | Post-developmental film-remaining ratio (%) | Adhesive property |
|---|---|---|---|---|
| Example 1 | 10 | Good | 95 | 100/100 |
| Example 2 | 10 | Good | 97 | 100/100 |
| Example 3 | 10 | Good | 94 | 100/100 |
| Example 4 | 10 | Good | 96 | 100/100 |
| Example 5 | 10 | Good | 96 | 100/100 |
| Example 6 | 10 | Good | 98 | 100/100 |
| Comparative Example 1 | 60 | Poor | 65 | 100/100 |
| Comparative Example 2 | 60 | Poor | 58 | 100/100 |

The smaller the value of the resolution is, the finer the pattern can be obtained, therefore, the higher the integration of LSI can be obtained. The photosensitive resin composition of the present invention has a remarkably excellent resolution.

Generally speaking, while the photosensitive resin composition having the post-developmental film-remaining ratio of 90% or more is good for practical use, the photosensitive resin composition having that of 60's % or less isn't suitable for practical use. Therefore, the photosensitive resin composition of the present invention has a remarkably excellent post-developmental film-remaining ratio.

The photosensitive resin composition and the photosensitive resin composition for an i-line stepper of the present invention which use a polyamic acid having excellent light-transmittance are excellent in image-forming ability and particularly suitable for pattern-formation with an i-line. The polyimide obtained therefrom is also excellent in mechanical properties, heat-resistance and adhesive property of the film.

What is claimed is:

1. A process for forming a pattern in a semiconductor integrated circuit or on a print substrate which comprises forming a film on a substrate by applying a photosensitive resin composition which comprises (A) a polyamic acid having a recurring unit represented by the formula (I):

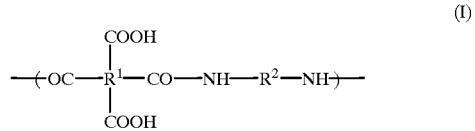

wherein $R^1$ represents

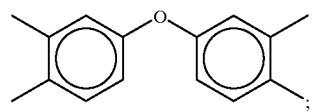

and $R^2$ represents a divalent organic group, (B) an acryl compound having an amino group and (C) a photoinitiator, exposing required portion to monochromatic light of i-line, and removing unnecessary portion.

2. The process according to claim 1, wherein the photosensitive resin composition further comprises (E) an azido compound.

3. The process according to claim 1, wherein the film formed on a substrate is 5 μm or more in thickness.

4. The process according to claim 1, wherein the recurring unit represented by the formula (I) is contained in an amount of 20–100 mole % based on total amount of recurring units in the polyamic acid.

5. The process according to claim 1, wherein $R_2$ is selected from the group consisting of

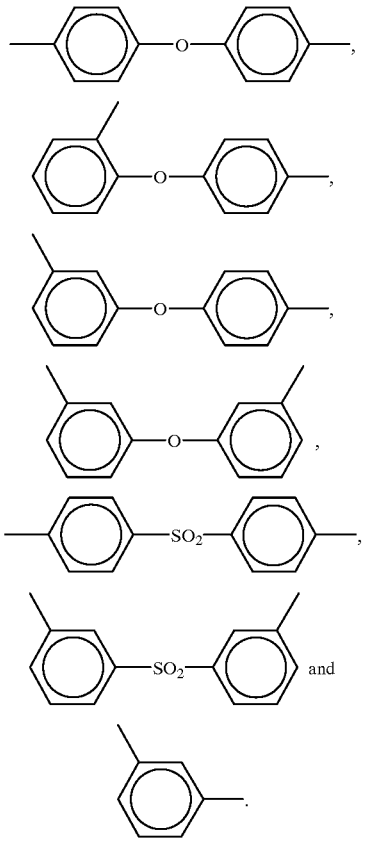

6. The process according to claim 1, wherein $R_2$ is selected from the group consisting of

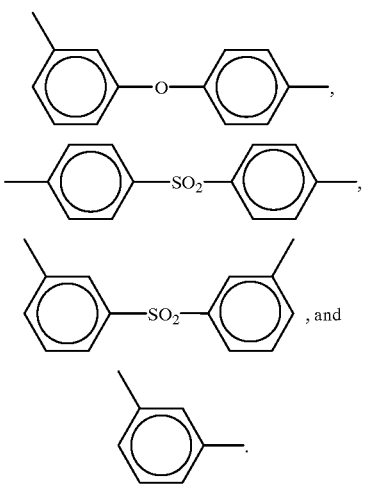

7. The process according to claim 1, wherein said polyamic acid is a polyamic acid formed from a diamine reactant, wherein said diamine reactant is a diaminopolysiloxane.

8. The process according to claim 7, wherein said diaminopolysiloxane is a material represented by the formula (III):

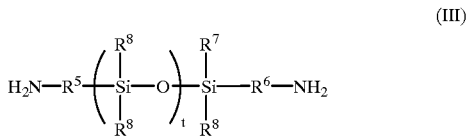

(III)

wherein $R^5$ and $R^6$ each represent a divalent hydrocarbon group; $R^7$ and $R^8$ each represent a monovalent hydrocarbon group; each of $R^5$ and $R^6$ may be the same or different; each of the $R^7$'s and $R^8$'s may be the same or different; and t represents an integer of 1 to 5.

9. A process for forming a pattern in a semiconductor integrated circuit or on a print substrate which comprises forming a film which is 20 μm or more in thickness on a substrate by applying a photosensitive resin composition which comprises (A) a polyamic acid having a recurring unit represented by the formula (I):

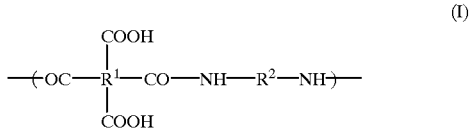

(I)

wherein $R^1$ represents

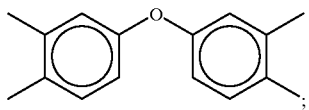

and $R^2$ represents a divalent organic group, (B) an acryl compound having an amino group and (C) a photoinitiator, exposing required portion of high of i-line, and removing unnecessary potion.

10. The process according to claim 9, wherein the photosensitive resin composition further comprises (E) an azido compound.

11. A process for forming a pattern in a semiconductor integrated circuit or on a print substrate, which comprises:

forming a film of a photosensitive resin composition which includes (A) a polyimide precursor, said polyimide precursor having been produced using oxydiphthalic acid or an acid anhydride thereof as a reactant for forming the polyimide precursor, and (B) a photoinitiator;

exposing a required portion of the film of the photosensitive resin composition to monochromatic light of i-line; and removing an unnecessary portion.

12. The process according to claim 11, wherein the photosensitive resin composition further includes (C) an acryl compound having an amino group.

13. The process according to claim 12, wherein the polyimide precursor is a reaction product of (1) an oxydiphthalic acid or an acid anhydride thereof and (2) a diamine.

14. The process according to claim 13, wherein said diamine is a diaminopolysiloxane.

15. The process according to claim 11, wherein the polyimide precursor is a reaction product of (1) an oxydiphthalic acid or an acid anhydride thereof and (2) a diamine.

16. The process according to claim 11, wherein the film of the photosensitive resin composition is formed to have a thickness of at least 5 μm.

17. The process according to claim 11, wherein the film of the photosensitive resin composition is formed to have a thickness of at least 20 μm.

18. The process according to claim 11, wherein an amount of the oxydiphthalic acid or acid anhydride thereof used in forming the polyimide precursor is at least 20 mole % based on the total acid or acid anhydride used in forming the polyimide precursor.

19. The process according to claim 11, wherein a light transmittance of a film of the polyimide precursor, having a thickness of 20 μm, to light having a wavelength of 365 nm, is at least 40%.

20. A process for forming a pattern in a semiconductor integrated circuit or on a print substrate, which comprises:

forming a film of a photosensitive resin composition which includes (A) a polyimide precursor, said polyimide precursor having been produced using oxydiphthalic acid or an acid anhydride thereof as a reactant for forming the polyimide precursor, and (B) a photoinitiator, the film of the photosensitive resin composition having a thickness of at least 20 μm;

exposing a required portion of the film of the photosensitive resin composition to light of i-line; and removing an unnecessary portion.

* * * * *